(12) United States Patent
Sato et al.

(10) Patent No.: US 11,356,073 B2
(45) Date of Patent: Jun. 7, 2022

(54) MULTILAYER FILTER

(71) Applicant: TDK CORPORATION, Tokyo (JP)

(72) Inventors: Takuya Sato, Tokyo (JP); Kazuhiro Tsukamoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/176,607

(22) Filed: Feb. 16, 2021

(65) Prior Publication Data

US 2021/0257984 A1 Aug. 19, 2021

(30) Foreign Application Priority Data

Feb. 17, 2020 (JP) .............................. JP2020-024560

(51) Int. Cl.
*H03H 7/01* (2006.01)
*H03H 7/09* (2006.01)
*H03H 1/00* (2006.01)

(52) U.S. Cl.
CPC ............ *H03H 7/0115* (2013.01); *H03H 7/09* (2013.01); *H03H 7/1766* (2013.01); *H03H 7/1783* (2013.01); *H03H 2001/0085* (2013.01)

(58) Field of Classification Search
CPC ......... H03H 2001/0085; H03H 7/1758; H03H 7/1766; H03H 7/0115; H03H 7/09
USPC .................................................. 333/175, 185
See application file for complete search history.

(56) References Cited

U.S. PATENT DOCUMENTS

| 2009/0189714 | A1* | 7/2009 | Sakisaka | ............... | H03H 7/1758 333/185 |
| 2015/0028969 | A1* | 1/2015 | Watanabe | ................ | H03H 7/09 333/185 |
| 2015/0303889 | A1* | 10/2015 | Muterspaugh | ......... | H03H 7/075 333/132 |
| 2019/0245506 | A1 | 8/2019 | Masuda | | |

FOREIGN PATENT DOCUMENTS

JP 2017-079362 A 4/2017

\* cited by examiner

*Primary Examiner* — Rakesh B Patel
(74) *Attorney, Agent, or Firm* — Oliff PLC

(57) ABSTRACT

In a multilayer filter, a first LC parallel resonance unit, a second LC parallel resonance unit, and an LC circuit unit are configured in an element body, in which the LC circuit unit is connected between the first LC parallel resonance unit and the second LC parallel resonance unit in a path between a first terminal electrode and a second terminal electrode, a conductor pattern constituting an inductor of the LC circuit unit is not disposed between a conductor pattern constituting a first inductor of the first LC parallel resonance unit and a conductor pattern constituting a second inductor of the second LC parallel resonance unit in the element body, and the first inductor of the first LC parallel resonance unit and the second inductor of the second LC parallel resonance unit are magnetically coupled.

4 Claims, 5 Drawing Sheets

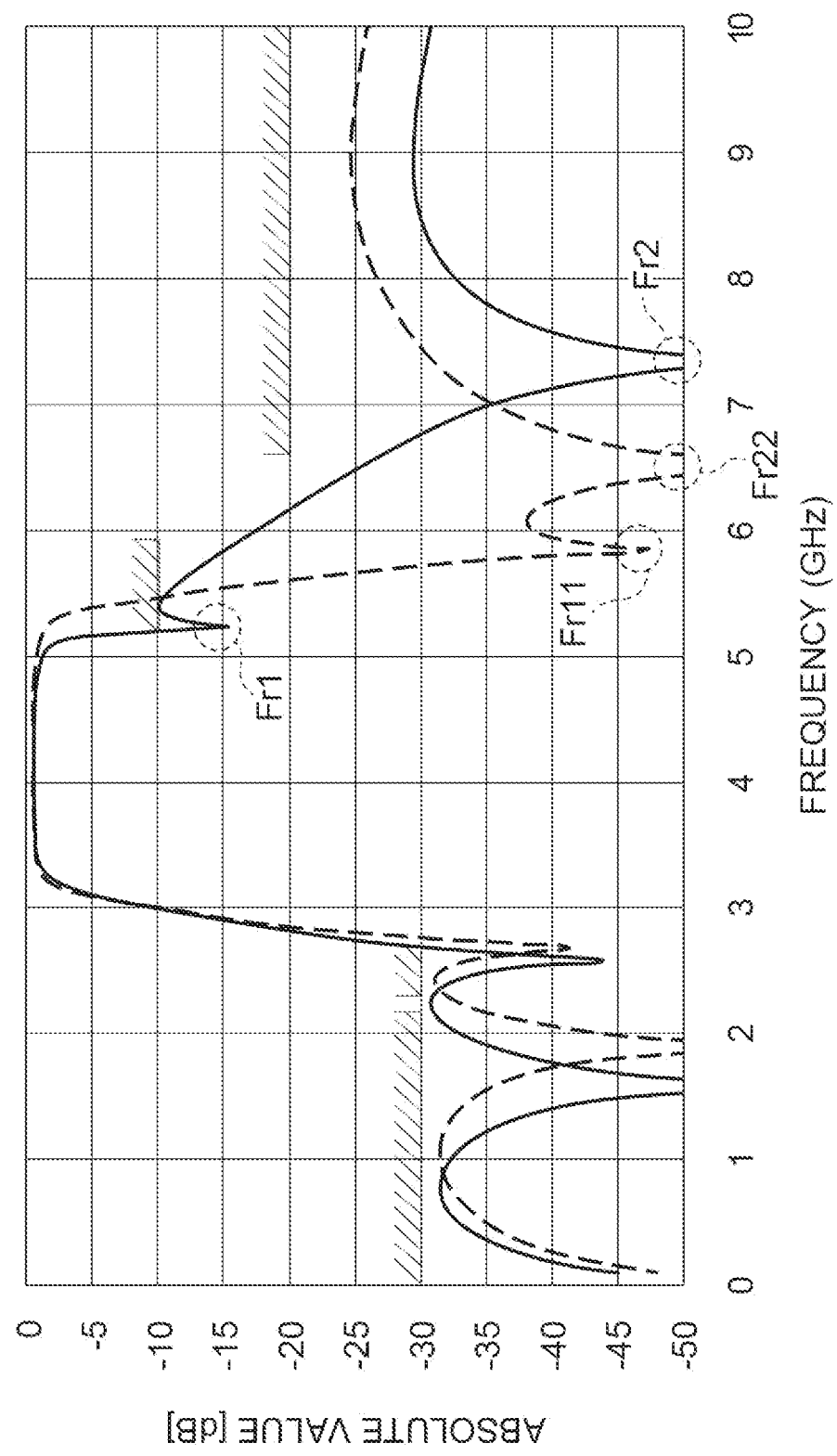

MULTILAYER FILTER

TECHNICAL FIELD

The present disclosure relates to a multilayer filter.

BACKGROUND

As a conventional multilayer filter, for example, a multilayer filter described in Patent Document 1 (Japanese Unexamined Patent Publication No. 2017-79362) is known. The multilayer filter described in Patent Document 1 includes an element body, and an input terminal electrode and an output terminal electrode disposed on a mounting surface of the element body. In the multilayer filter of Patent Document 1, two LC parallel resonance units and an LC series resonance unit connected between the two LC parallel resonance units are configured in the element body.

SUMMARY

One aspect of the present invention is to provide a multilayer filter in which an attenuation characteristic can be improved.

A multilayer filter according to one aspect of the present invention includes an element body formed by laminating a plurality of insulator layers, and a first terminal and a second terminal disposed on an outer surface of the element body, in which the inside of the element body is configured by a first LC parallel resonance unit configured by a first inductor and a first capacitor connected in parallel, a second LC parallel resonance unit configured by a second inductor and a second capacitor connected in parallel, and an LC circuit unit configured to include an inductor and a capacitor, the LC circuit unit is connected between the first LC parallel resonance unit and the second LC parallel resonance unit in a path between the first terminal and the second terminal, a conductor pattern constituting the inductor of the LC circuit unit is not disposed between a conductor pattern constituting the first inductor of the first LC parallel resonance unit and a conductor pattern constituting the second inductor of the second LC parallel resonance unit in the element body, and the first inductor of the first LC parallel resonance unit and the second inductor of the second LC parallel resonance unit are magnetically coupled.

In the multilayer filter according to one aspect of the present invention, the conductor pattern constituting the inductor of the LC circuit unit is not disposed between the conductor pattern constituting the first inductor of the first LC parallel resonance unit and the conductor pattern constituting the second inductor of the second LC parallel resonance unit in the element body. As described above, since the inductor of the LC circuit unit is not disposed between the first LC parallel resonance unit and the second LC parallel resonance unit, a distance between the first LC parallel resonance unit and the second LC parallel resonance unit can be made to be small in the multilayer filter. Thereby, the magnetic coupling between the first inductor and the second inductor can be increased in the multilayer filter. Therefore, a distance between an attenuation peak (attenuation pole) of the first LC parallel resonance unit and an attenuation peak of the second LC parallel resonance unit can be increased in the multilayer filter. Accordingly, the attenuation can be made to be steep in the multilayer filter. As a result, an attenuation characteristic can be improved in the multilayer filter.

In one embodiment, the LC circuit unit may be configured to include a first LC series resonance unit configured by a third inductor and a third capacitor connected in series, and a second LC series resonance unit configured by a fourth inductor and a fourth capacitor connected in series, and the first LC series resonance unit and the second LC series resonance unit may be disposed at positions sandwiching the first LC parallel resonance unit and the second LC parallel resonance unit therebetween and disposed to be spaced apart on outer sides of the first LC parallel resonance unit and the second LC parallel resonance unit. In this configuration, the magnetic coupling between the third inductor of the first LC series resonance unit and the fourth inductor of the second LC series resonance unit is made to be small compared to the magnetic coupling between the first inductor of the first LC parallel resonance unit and the second inductor of the second LC parallel resonance unit. Thereby, a filter having a deep attenuation in a narrow band of frequencies can be realized in the multilayer filter. Accordingly, the attenuation characteristic can be improved in the multilayer filter.

In one embodiment, the first inductor, the second inductor, the third inductor, and the fourth inductor may each be configured by a conductor pattern and a through-hole conductor.

One embodiment may be a multiplexer including a bandpass filter configured to have the first LC parallel resonance unit, the second LC parallel resonance unit, and the LC circuit unit. In this configuration, the multilayer filter can be made to function as a multiplexer.

According to one aspect of the present invention, an attenuation characteristic can be improved.

BRIEF DESCRIPTION OF THE DRAWINGS

FIG. 5 is a view showing an attenuation characteristic.

DETAILED DESCRIPTION

Hereinafter, a preferred embodiment of the present invention will be described in detail with reference to the accompanying drawings. In the description of the drawings, the same elements or elements having the same functions will be denoted by the same reference signs and duplicate descriptions thereof will be omitted.

Figure 1:
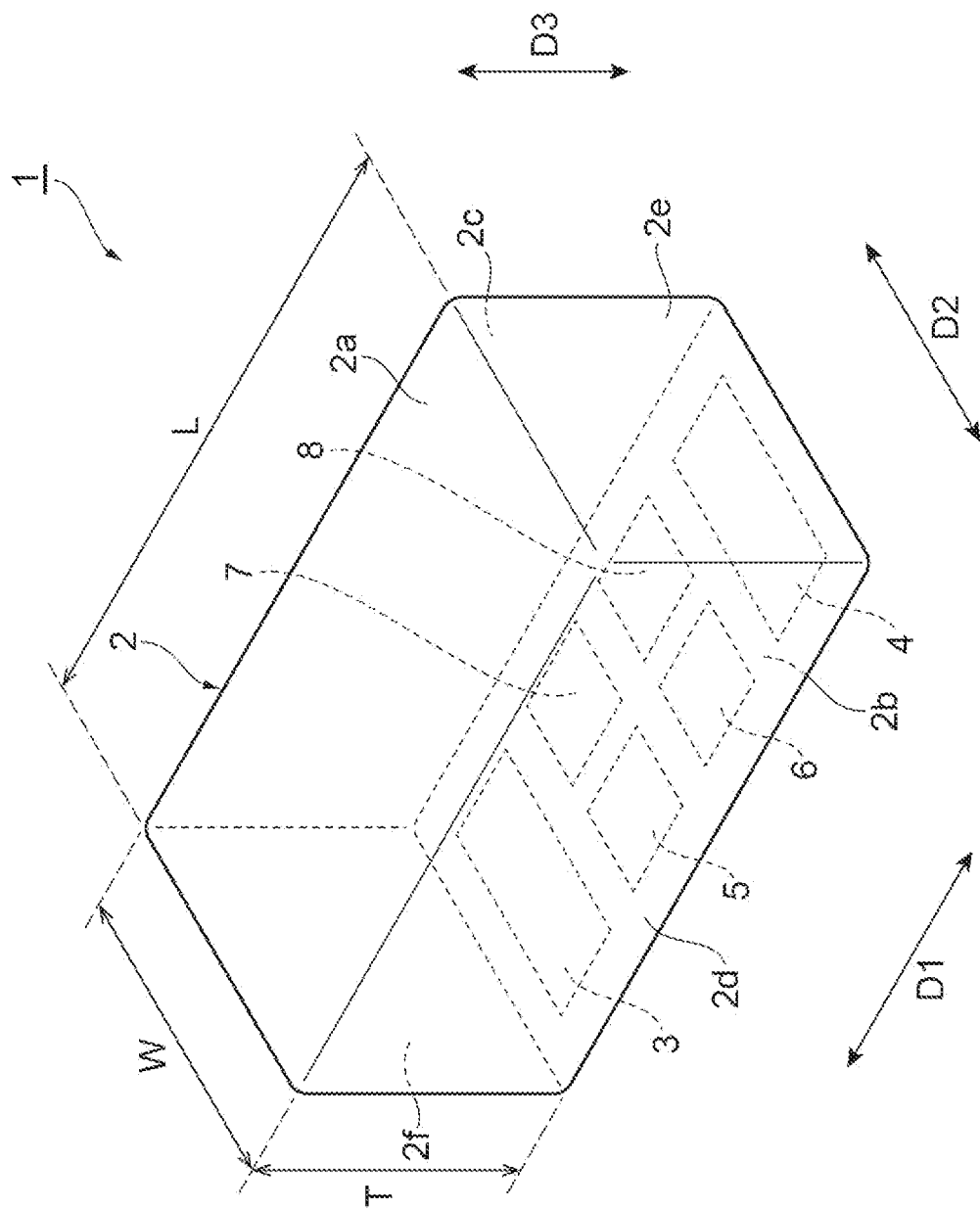
FIG. 1 is a perspective view of a multilayer filter according to one embodiment.

As illustrated in FIG. 1, a multilayer filter 1 includes an element body 2, a first terminal electrode (first terminal) 3, a second terminal electrode (second terminal) 4, a first ground electrode 5, a second ground electrode 6, a third ground electrode 7, and a fourth ground electrode 8. The multilayer filter 1 is a bandpass filter that allows signals in a specific frequency band to pass through and does not allow signals in frequency bands other than the specific frequency band to pass through (attenuate). The multilayer filter 1 is mounted on an electronic device (for example, a circuit board, an electronic board, or the like) so that the first terminal electrode 3 and the second terminal electrode 4 are connected to signal lines, and the first ground electrode 5, the second ground electrode 6, the third ground electrode 7, and the fourth ground electrode 8 are connected to the ground.

The element body 2 has a rectangular parallelepiped shape. As the outer surface thereof, the element body 2 includes a first main surface 2a and a second main surface 2b having rectangular shapes and facing each other, a first side surface 2c and a second side surface 2d facing each other, and a first end surface (side surface) 2e and a second end surface (side surface) 2f facing each other. The second main surface 2b of the element body 2 constitutes a mounting surface facing an electronic device.

A direction in which the first end surface 2e and the second end surface 2f face each other, that is, a longitudinal direction of the element body 2 is a first direction D1. A direction in which the first side surface 2c and the second side surface 2d face each other, that is, a width direction of the element body 2 is a second direction D2. A direction in which the first main surface 2a and the second main surface 2b face each other is a third direction D3. The rectangular parallelepiped shape includes a rectangular parallelepiped shape in which corner portions and ridge line portions are chamfered, and a rectangular parallelepiped shape in which corner portions and ridge line portions are rounded. The element body 2 may have, for example, a length L of about 1.6 mm, a width W of about 0.8 mm, and a height T of about 0.7 mm.

Figure 2:
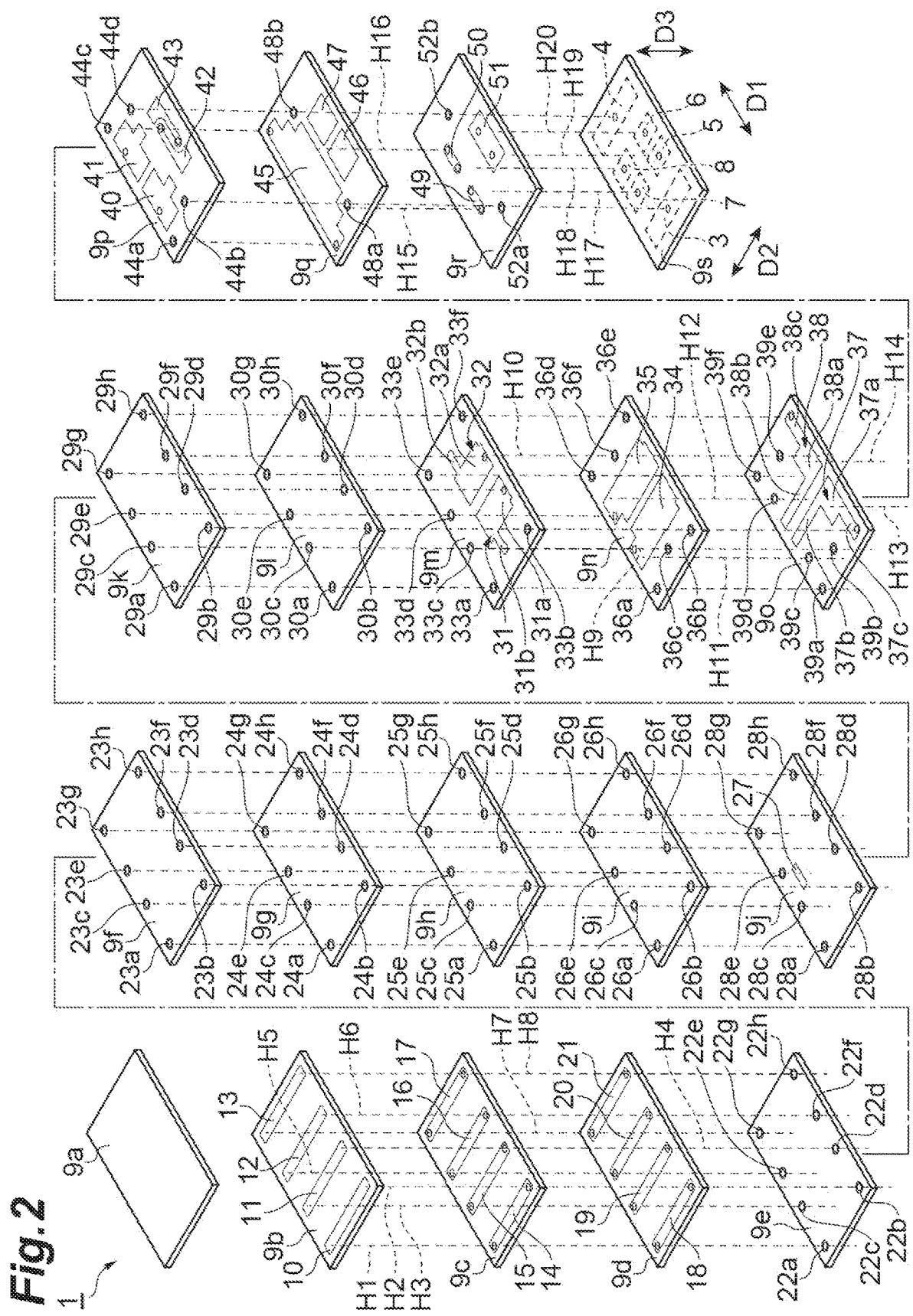
FIG. 2 is an exploded perspective view of the multilayer filter.

As illustrated in FIG. 2, the element body 2 is made of a dielectric ceramic (a $BaTiO_3$-based ceramic, a glass ceramic, or the like). The element body 2 is constituted by a laminating a plurality of dielectric layers (insulator layers) 9a to 9s. The dielectric layers 9a to 9s are each formed of a sintered body of a ceramic green sheet including, for example, a dielectric material (a $BaTiO_3$-based material, a $Ba(Ti, Zr)O_3$-based material, a $(Ba, Ca)TiO_3$-based material, a glass material, an alumina material, or the like). Of the dielectric layers 9a to 9s, the dielectric layers 9a and 9s are disposed on outermost surface layers of the element body 2 as protective layers. In the actual element body 2, the dielectric layers 9a to 9s are integrated to such an extent that boundaries between the layers cannot be visually recognized. A height direction of the element body 2, that is, the direction in which the first main surface 2a and the second main surface 2b face each other coincides with a direction in which the plurality of dielectric layers 9a to 9s are laminated (hereinafter simply referred to as a "lamination direction").

A first coil conductor (conductor pattern) 10, a second coil conductor 11, a third coil conductor 12, and a fourth coil conductor 13 are disposed in the dielectric layer 9b. The first coil conductor 10, the second coil conductor 11, the third coil conductor 12, and the fourth coil conductor 13 contain a conductive material (for example, Ag, Pd, or the like). The first coil conductor 10, the second coil conductor 11, the third coil conductor 12, and the fourth coil conductor 13 are configured as a sintered body of a conductive paste containing a conductive material (for example, Ag powder, Pd powder, or the like). Hereinafter, coil conductors are formed in the same manner.

The first coil conductor 10 has a substantially linear shape (substantially I-shape). The first coil conductor 10 is disposed on the second end surface 2f side of the element body 2 in the dielectric layer 9b. The first coil conductor 10 is disposed so that a longitudinal direction of the first coil conductor 10 extends in the second direction D2 of the element body 2. The second coil conductor 11 has a substantially linear shape. The second coil conductor 11 is disposed on a central portion side of the dielectric layer 9b. The second coil conductor 11 is disposed so that a longitudinal direction of the second coil conductor 11 extends in the second direction D2 of the element body 2.

The third coil conductor 12 has a substantially linear shape. The third coil conductor 12 is disposed on the central portion side of the dielectric layer 9b. The third coil conductor 12 is disposed so that a longitudinal direction of the third coil conductor 12 extends in the second direction D2 of the element body 2. The fourth coil conductor 13 has a substantially linear shape. The fourth coil conductor 13 is disposed on the first end surface 2e side of the element body 2 in the dielectric layer 9b. The fourth coil conductor 13 is disposed so that a longitudinal direction of the fourth coil conductor 13 extends in the second direction D2 of the element body 2.

A fifth coil conductor 14, a sixth coil conductor 15, a seventh coil conductor 16, and an eighth coil conductor 17 are disposed in the dielectric layer 9c. The fifth coil conductor 14 has the same configuration as the first coil conductor 10. The fifth coil conductor 14 is disposed at a position overlapping the first coil conductor 10 in the lamination direction. The fifth coil conductor 14 is electrically connected to the first coil conductor 10 via a through-hole conductor H1 and a through-hole conductor H2.

The sixth coil conductor 15 has the same configuration as the second coil conductor 11. The sixth coil conductor 15 is disposed at a position overlapping the second coil conductor 11 in the lamination direction. The sixth coil conductor 15 is electrically connected to the second coil conductor 11 via a through-hole conductor H3 and a through-hole conductor H4.

The seventh coil conductor 16 has the same configuration as the third coil conductor 12. The seventh coil conductor 16 is disposed at a position overlapping the third coil conductor 12 in the lamination direction. The seventh coil conductor 16 is electrically connected to the third coil conductor 12 via a through-hole conductor H5 and a through-hole conductor H6.

The eighth coil conductor 17 has the same configuration as the fourth coil conductor 13. The eighth coil conductor 17 is disposed at a position overlapping the fourth coil conductor 13 in the lamination direction. The eighth coil conductor 17 is electrically connected to the fourth coil conductor 13 via a through-hole conductor H7 and a through-hole conductor H8.

A ninth coil conductor 18, a tenth coil conductor 19, an eleventh coil conductor 20, and a twelfth coil conductor 21 are disposed in the dielectric layer 9d. The ninth coil conductor 18 has the same configuration as the first coil conductor 10. The ninth coil conductor 18 is disposed at a position overlapping the fifth coil conductor 14 in the lamination direction. The ninth coil conductor 18 is electrically connected to the fifth coil conductor 14 via the through-hole conductor H1 and the through-hole conductor H2.

The tenth coil conductor 19 has the same configuration as the second coil conductor 11. The tenth coil conductor 19 is disposed at a position overlapping the sixth coil conductor 15 in the lamination direction. The tenth coil conductor 19 is electrically connected to the sixth coil conductor 15 via the through-hole conductor H3 and the through-hole conductor H4.

The eleventh coil conductor 20 has the same configuration as the third coil conductor 12. The eleventh coil conductor 20 is disposed at a position overlapping the seventh coil conductor 16 in the lamination direction. The eleventh coil conductor 20 is electrically connected to the seventh coil conductor 16 via the through-hole conductor H5 and the through-hole conductor H6.

The twelfth coil conductor 21 has the same configuration as the fourth coil conductor 13. The twelfth coil conductor 21 is disposed at a position overlapping the eighth coil conductor 17 in the lamination direction. The twelfth coil conductor 21 is electrically connected to the eighth coil conductor 17 via the through-hole conductor H7 and the through-hole conductor H8.

Via conductors 22a, 22b, 22c, 22d, 22e, 22f, 22g, and 22h are disposed in the dielectric layer 9e. The via conductor 22a is disposed at a position overlapping the through-hole conductor H1 in the lamination direction and is electrically connected to the through-hole conductor H1. The via conductor 22b is disposed at a position overlapping the through-hole conductor H2 in the lamination direction and is electrically connected to the through-hole conductor H2. The via conductor 22c is disposed at a position overlapping the through-hole conductor H3 in the lamination direction and is electrically connected to the through-hole conductor H3. The via conductor 22d is disposed at a position overlapping the through-hole conductor H4 in the lamination direction and is electrically connected to the through-hole conductor H4.

The via conductor 22e is disposed at a position overlapping the through-hole conductor H5 in the lamination direction and is electrically connected to the through-hole conductor H5. The via conductor 22f is disposed at a position overlapping the through-hole conductor H6 in the lamination direction and is electrically connected to the through-hole conductor H6. The via conductor 22g is disposed at a position overlapping the through-hole conductor H7 in the lamination direction and is electrically connected to the through-hole conductor H7. The via conductor 22h is disposed at a position overlapping the through-hole conductor H8 in the lamination direction and is electrically connected to the through-hole conductor H8.

Via conductors 23a, 23b, 23c, 23d, 23e, 23f, 23g, and 23h are disposed in the dielectric layer 9f. Via conductors 24a, 24b, 24c, 24d, 24e, 24f, 24g, and 24h are disposed in the dielectric layer 9g. Via conductors 25a, 25b, 25c, 25d, 25e, 25f, 25g, and 25h are disposed in the dielectric layer 9h. Via conductors 26a, 26b, 26c, 26d, 26e, 26f, 26g, and 26h are disposed in the dielectric layer 9i.

The via conductors 23a, 24a, 25a, and 26a are each disposed at a position overlapping the through-hole conductor H1 in the lamination direction and are electrically connected to the through-hole conductor H1. The via conductors 23b, 24b, 25b, and 26b are each disposed at a position overlapping the through-hole conductor H2 in the lamination direction and are electrically connected to the through-hole conductor H2. The via conductors 23c, 24c, 25c, and 26c are each disposed at a position overlapping the through-hole conductor H3 in the lamination direction and are electrically connected to the through-hole conductor H3. The via conductors 23d, 24d, 25d, and 26d are each disposed at a position overlapping the through-hole conductor H4 in the lamination direction and are electrically connected to the through-hole conductor H4.

The via conductors 23e, 24e, 25e, and 26e are each disposed at a position overlapping the through-hole conductor H5 in the lamination direction and are electrically connected to the through-hole conductor H5. The via conductors 23f, 24f, 25f, and 26f are each disposed at a position overlapping the through-hole conductor H6 in the lamination direction and are electrically connected to the through-hole conductor H6. The via conductors 23g, 24g, 25g, and 26g are each disposed at a position overlapping the through-hole conductor H7 in the lamination direction and are electrically connected to the through-hole conductor H7. The via conductors 23h, 24h, 25h, and 26h are each disposed at a position overlapping the through-hole conductor H8 in the lamination direction and are electrically connected to the through-hole conductor H8.

A first internal electrode 27 and via conductors 28a, 28b, 28c, 28d, 28e, 28f, 28g, and 28h are disposed in the dielectric layer 9j. The first internal electrode 27 has a rectangular shape. The first internal electrode 27 is disposed so that a longitudinal direction of the first internal electrode 27 extends in the first direction D1 of the element body 2. The first internal electrode 27 contains a conductive material (for example, Ag, Pd, or the like). The first internal electrode 27 is configured as a sintered body of a conductive paste containing a conductive material (for example, Ag powder, Pd powder, or the like). Hereinafter, internal electrodes are formed in the same manner.

The via conductor 28a is disposed at a position overlapping the through-hole conductor H1 in the lamination direction and is electrically connected to the through-hole conductor H1. The via conductor 28b is disposed at a position overlapping the through-hole conductor H2 in the lamination direction and is electrically connected to the through-hole conductor H2. The via conductor 28c is disposed at a position overlapping the through-hole conductor H3 in the lamination direction and is electrically connected to the through-hole conductor H3. The via conductor 28d is disposed at a position overlapping the through-hole conductor H4 in the lamination direction and is electrically connected to the through-hole conductor H4.

The via conductor 28e is disposed at a position overlapping the through-hole conductor H5 in the lamination direction and is electrically connected to the through-hole conductor H5. The via conductor 28f is disposed at a position overlapping the through-hole conductor H6 in the lamination direction and is electrically connected to the through-hole conductor H6. The via conductor 28g is disposed at a position overlapping the through-hole conductor H7 in the lamination direction and is electrically connected to the through-hole conductor H7. The via conductor 28h is disposed at a position overlapping the through-hole conductor H8 in the lamination direction and is electrically connected to the through-hole conductor H8.

Via conductors 29a, 29b, 29c, 29d, 29e, 29f, 29g, and 29h are disposed in the dielectric layer 9k. Via conductors 30a, 30b, 30c, 30d, 30e, 30f, 30g, and 30h are disposed in the dielectric layer 9l.

The via conductors 29a and 30a are each disposed at a position overlapping the through-hole conductor H1 in the lamination direction and are electrically connected to the through-hole conductor H1. The via conductors 29b and 30b are each disposed at a position overlapping the through-hole conductor H2 in the lamination direction and are electrically connected to the through-hole conductor H2. The via conductors 29c and 30c are each disposed at a position overlapping the through-hole conductor H3 in the lamination direction and are electrically connected to the through-hole conductor H3. The via conductors 29d and 30d are each disposed at a position overlapping the through-hole conductor H4 in the lamination direction and are electrically connected to the through-hole conductor H4.

The via conductors 29e and 30e are each disposed at a position overlapping the through-hole conductor H5 in the lamination direction and are electrically connected to the through-hole conductor H5. The via conductors 29f and 30f are each disposed at a position overlapping the through-hole conductor H6 in the lamination direction and are electrically connected to the through-hole conductor H6. The via conductors 29g and 30g are each disposed at a position overlapping the through-hole conductor H7 in the lamination direction and are electrically connected to the through-hole conductor H7. The via conductors 29h and 30h are each disposed at a position overlapping the through-hole conductor H8 in the lamination direction and are electrically connected to the through-hole conductor H8.

A second internal electrode 31, a third internal electrode 32, and via conductors 33a, 33b, 33c, 33d, 33e, and 33f are disposed in the dielectric layer 9m. The second internal electrode 31 is disposed on the second end surface 2f side and the second side surface 2d side of the dielectric layer 9m. The second internal electrode 31 includes a main body portion 31a and a lead-out portion 31b extending from one end of the main body portion 31a. The main body portion 31a has a substantially rectangular shape. The lead-out portion 31b extends from one side of the main body portion 31a toward the second end surface 2f of the element body 2. The main body portion 31a is disposed at a position overlapping the through-hole conductor H4 in the lamination direction and is electrically connected to the through-hole conductor H4.

The third internal electrode 32 is disposed on the first end surface 2e side and the second side surface 2d side of the dielectric layer 9m. The third internal electrode 32 includes a main body portion 32a and a lead-out portion 32b extending from one end of the main body portion 32a. The main body portion 32a has a substantially rectangular shape. The lead-out portion 32b extends from one side of the main body portion 32a toward the first end surface 2e of the element body 2. The main body portion 32a is disposed at a position overlapping the through-hole conductor H6 in the lamination direction and is electrically connected to the through-hole conductor H6.

The via conductor 33a is disposed at a position overlapping the through-hole conductor H1 in the lamination direction and is electrically connected to the through-hole conductor H1. The via conductor 33b is disposed at a position overlapping the through-hole conductor H2 in the lamination direction and is electrically connected to the through-hole conductor H2. The via conductor 33c is disposed at a position overlapping the through-hole conductor H3 in the lamination direction and is electrically connected to the through-hole conductor H3. The via conductor 33d is disposed at a position overlapping the through-hole conductor H5 in the lamination direction and is electrically connected to the through-hole conductor H5. The via conductor 33e is disposed at a position overlapping the through-hole conductor H7 in the lamination direction and is electrically connected to the through-hole conductor H7. The via conductor 33f is disposed at a position overlapping the through-hole conductor H8 in the lamination direction and is electrically connected to the through-hole conductor H8.

A fourth internal electrode 34, a fifth internal electrode 35, and via conductors 36a, 36b, 36c, 36d, 36e, and 36f are disposed in the dielectric layer 9n. The fourth internal electrode 34 is disposed on the second end surface 2f side of the dielectric layer 9n. The fourth internal electrode 34 has a substantially rectangular shape. The fourth internal electrode 34 is disposed at a position overlapping the through-hole conductor H3 in the lamination direction and is electrically connected to the through-hole conductor H3. The fifth internal electrode 35 is disposed on the first end surface 2e side of the dielectric layer 9n. The fifth internal electrode 35 has a substantially rectangular shape. The fifth internal electrode 35 is disposed at a position overlapping the through-hole conductor H5 in the lamination direction and is electrically connected to the through-hole conductor H5.

The via conductor 36a is disposed at a position overlapping the through-hole conductor H1 in the lamination direction and is electrically connected to the through-hole conductor H1. The via conductor 36b is disposed at a position overlapping the through-hole conductor H2 in the lamination direction and is electrically connected to the through-hole conductor H2. The via conductor 36c is disposed at a position overlapping the lead-out portion 31b of the second internal electrode 31 in the lamination direction and is electrically connected to the second internal electrode 31 by a through-hole conductor H9. The via conductor 36d is disposed at a position overlapping the through-hole conductor H7 in the lamination direction and is electrically connected to the through-hole conductor H7. The via conductor 36e is disposed at a position overlapping the through-hole conductor H8 in the lamination direction and is electrically connected to the through-hole conductor H8. The via conductor 36f is disposed at a position overlapping the lead-out portion 32b of the third internal electrode 32 in the lamination direction and is electrically connected to the third internal electrode 32 by a through-hole conductor H10.

A sixth internal electrode 37, a seventh internal electrode 38, and via conductors 39a, 39b, 39c, 39d, 39e, and 39f are disposed in the dielectric layer 9o. The sixth internal electrode 37 is disposed on the second end surface 2f side of the dielectric layer 9o. The sixth internal electrode 37 has a substantially L-shape as a whole. The sixth internal electrode 37 includes a first electrode portion 37a, a second electrode portion 37b extending from one end of the first electrode portion 37a, and a lead-out portion 37c extending from one end of the first electrode portion 37a. The lead-out portion 37c is disposed at a position overlapping the through-hole conductor H2 in the lamination direction and is electrically connected to the through-hole conductor H2.

The seventh internal electrode 38 is disposed on the first end surface 2e side of the dielectric layer 9o. The seventh internal electrode 38 has a substantially L-shape as a whole. The seventh internal electrode 38 includes a first electrode portion 38a, a second electrode portion 38b extending from one end of the first electrode portion 38a, and a lead-out portion 38c extending from one end of the first electrode portion 38a. The lead-out portion 38c is disposed at a position overlapping the through-hole conductor H8 in the lamination direction and is electrically connected to the through-hole conductor H8.

The via conductor 39a is disposed at a position overlapping the through-hole conductor H1 in the lamination direction and is electrically connected to the through-hole conductor H1. The via conductor 39b is disposed at a position overlapping the through-hole conductor H9 in the lamination direction and is electrically connected to the through-hole conductor H9. The via conductor 39c is disposed at a position overlapping the through-hole conductor H11 in the lamination direction and is electrically connected to the fourth internal electrode 34 by the through-hole conductor H11. The via conductor 39d is disposed at a position overlapping the through-hole conductor H12 in the lamination direction and is electrically connected to the fifth internal electrode 35 by the through-hole conductor H12. The via conductor 39e is disposed at a position overlapping the through-hole conductor H10 in the lamination direction and is electrically connected to the through-hole conductor H10. The via conductor 39f is disposed at a position overlapping the through-hole conductor H7 in the lamination direction and is electrically connected to the through-hole conductor H7.

An eighth internal electrode 40, a ninth internal electrode 41, a tenth internal electrode 42, an eleventh internal electrode 43, and via conductors 44a, 44b, 44c, 44d are disposed in the dielectric layer 9p. The eighth internal electrode 40 is disposed on the second end surface 2f side and the first side surface 2c side on the dielectric layer 9p. The eighth internal electrode 40 has a convex shape. The eighth internal electrode 40 is disposed at a position overlapping the through-hole conductor H11 in the lamination direction and is electrically connected to the through-hole conductor H11. The ninth internal electrode 41 is disposed on the first end surface 2e side and the first side surface 2c side on the dielectric layer 9p. The ninth internal electrode 41 has a convex shape. The ninth internal electrode 41 is disposed at a position overlapping the through-hole conductor H12 in the lamination direction and is electrically connected to the through-hole conductor H12.

The tenth internal electrode 42 is disposed on the second side surface 2d side on the dielectric layer 9p. The tenth internal electrode 42 has a substantially L-shape. An end portion of the tenth internal electrode 42 is disposed at a position overlapping the first electrode portion 38a of the seventh internal electrode 38 in the lamination direction and is electrically connected to the seventh internal electrode 38 by the through-hole conductor H13. The eleventh internal electrode 43 is disposed on the second side surface 2d side on the dielectric layer 9p. The eleventh internal electrode 43 has a substantially L-shape. An end portion of the 11th internal electrode 43 is disposed at a position overlapping the first electrode portion 37a of the sixth internal electrode 37 in the lamination direction and is electrically connected to the sixth internal electrode 37 by the through-hole conductor H14.

The via conductor 44a is disposed at a position overlapping the through-hole conductor H1 in the lamination direction and is electrically connected to the through-hole conductor H1. The via conductor 44b is disposed at a position overlapping the through-hole conductor H9 in the lamination direction and is electrically connected to the through-hole conductor H9. The via conductor 44c is disposed at a position overlapping the through-hole conductor H7 in the lamination direction and is electrically connected to the through-hole conductor H7. The via conductor 44d is disposed at a position overlapping the through-hole conductor H10 in the lamination direction and is electrically connected to the through-hole conductor H10.

A twelfth internal electrode 45, a thirteenth internal electrode 46, a fourteenth internal electrode 47, and via conductors 48a and 48b are disposed in the dielectric layer 9q. The twelfth internal electrode 45 is disposed on the first side surface 2c side on the dielectric layer 9q. The twelfth internal electrode 45 extends in the first direction D1 of the element body 2. The twelfth internal electrode 45 is disposed at a position overlapping the through-hole conductor H1 and the through-hole conductor H7 in the lamination direction and is electrically connected to the through-hole conductor H1 and the through-hole conductor H7. The thirteenth internal electrode 46 is disposed on the second end surface 2f side and the second side surface 2d side on the dielectric layer 9q. The thirteenth internal electrode 46 has a rectangular shape. The fourteenth internal electrode 47 is disposed on the first end surface 2e side and the second side surface 2d side on the dielectric layer 9q. The fourteenth internal electrode 47 has a rectangular shape.

The via conductor 48a is disposed at a position overlapping the through-hole conductor H9 in the lamination direction and is electrically connected to the through-hole conductor H9. The via conductor 48b is disposed at a position overlapping the through-hole conductor H10 in the lamination direction and is electrically connected to the through-hole conductor H10.

A first connecting conductor 49, a second connecting conductor 50, a third connecting conductor 51, and via conductors 52a and 52b are disposed in the dielectric layer 9r. The first connecting conductor 49 is disposed on the second end surface 2f side and the first side surface 2c side on the dielectric layer 9r. The first connecting conductor 49 has a linear shape. The first connecting conductor 49 is disposed at a position overlapping the twelfth internal electrode 45 in the lamination direction and is electrically connected to the twelfth internal electrode 45 by the through-hole conductor H15. The first connecting conductor 49 is disposed at a position overlapping the third ground electrode 7 in the lamination direction and is electrically connected to the third ground electrode 7 by the through-hole conductor H17.

The second connecting conductor 50 is disposed on the first end surface 2e side and the first side surface 2c side on the dielectric layer 9r. The second connecting conductor 50 has a linear shape. The second connecting conductor 50 is disposed at a position overlapping the twelfth internal electrode 45 in the lamination direction and is electrically connected to the twelfth internal electrode 45 by the through-hole conductor H16. The second connecting conductor 50 is disposed at a position overlapping the fourth ground electrode 8 in the lamination direction and is electrically connected to the fourth ground electrode 8 by the through-hole conductor H18.

The third connecting conductor 51 is disposed on the second side surface 2d side on the dielectric layer 9r. The third connecting conductor 51 has a rectangular shape. The third connecting conductor 51 is disposed at a position overlapping the thirteenth internal electrode 46 and the first ground electrode 5 in the lamination direction and is electrically connected to the thirteenth internal electrode 46 and the first ground electrode 5 by the through-hole conductor H19. The third connecting conductor 51 is disposed at a position overlapping the fourteenth internal electrode 47 and the second ground electrode 6 in the lamination direction and is electrically connected to the fourteenth internal electrode 47 and the second ground electrode 6 by the through-hole conductor H20.

The via conductor 52a is disposed at a position overlapping the through-hole conductor H9 in the lamination direction and is electrically connected to the through-hole conductor H9. The via conductor 52a is electrically connected to the first terminal electrode 3 by the through-hole conductor H9. The via conductor 52b is disposed at a position overlapping the through-hole conductor H10 in the lamination direction and is electrically connected to the through-hole conductor H10. The via conductor 52b is electrically connected to the second terminal electrode 4 by the through-hole conductor H10.

As illustrated in FIG. 1, the first terminal electrode 3 and the second terminal electrode 4 are disposed on the second main surface 2b of the element body 2. The first terminal electrode 3 and the second terminal electrode 4 each have a rectangular shape. The first terminal electrode 3 is positioned on the second end surface 2f side of the second main surface 2b and is disposed so that a longitudinal direction of the first terminal electrode 3 is in the second direction D2 of the element body 2. The second terminal electrode 4 is positioned on the first end surface 2e side of the second main surface 2b and is disposed so that a longitudinal direction of the second terminal electrode 4 is in the second direction D2 of the element body 2. The first terminal electrode 3 and the second terminal electrode 4 are disposed with a predetermined distance therebetween in the first direction D1 of the element body 2.

The first ground electrode 5, the second ground electrode 6, the third ground electrode 7, and the fourth ground electrode 8 are disposed on the second main surface 2b of the element body 2. The first ground electrode 5, the second ground electrode 6, the third ground electrode 7, and the fourth ground electrode 8 each have a rectangular shape. The first ground electrode 5 and the second ground electrode 6 are disposed between the first terminal electrode 3 and the second terminal electrode 4. The first ground electrode 5 and the second ground electrode 6 are disposed on the second side surface 2d side of the second main surface 2b. The first ground electrode 5 is disposed on the second end surface 2f side of the second main surface 2b. The second ground electrode 6 is disposed on the first end surface 2e side of the second main surface 2b. The first ground electrode 5 and the second ground electrode 6 are disposed with a predetermined distance therebetween in the first direction D1 of the element body 2.

The third ground electrode 7 and the fourth ground electrode 8 are disposed between the first terminal electrode 3 and the second terminal electrode 4. The third ground electrode 7 and the fourth ground electrode 8 are disposed on the first side surface 2c side of the second main surface 2b. The third ground electrode 7 is disposed on the second end surface 2f side of the second main surface 2b. The third ground electrode 7 and the first ground electrode 5 are disposed with a predetermined distance therebetween in the second direction D2 of the element body 2. The fourth ground electrode 8 is disposed on the first end surface 2e side of the second main surface 2b. The fourth ground electrode 8 and the second ground electrode 6 are disposed with a predetermined distance therebetween in the second direction D2 of the element body 2. The third ground electrode 7 and the fourth ground electrode 8 are disposed with a predetermined distance therebetween in the first direction D1 of the element body 2.

The first terminal electrode 3, the second terminal electrode 4, the first ground electrode 5, the second ground electrode 6, the third ground electrode 7, and the fourth ground electrode 8 contains a conductive material (for example, Ag, Pd, or the like). The first terminal electrode 3, the second terminal electrode 4, the first ground electrode 5, the second ground electrode 6, the third ground electrode 7, and the fourth ground electrode 8 are configured as a sintered body of a conductive paste containing a conductive material (for example, Ag powder, Pd powder, or the like). A plating layer is formed on surfaces of the first terminal electrode 3, the second terminal electrode 4, the first ground electrode 5, the second ground electrode 6, the third ground electrode 7, and the fourth ground electrode 8. The plating layer may be formed by, for example, electroplating. The plating layer includes a layer structure formed of a Cu plating layer, a Ni plating layer, and a Sn plating layer, a layer structure formed of a Ni plating layer and a Sn plating layer, or the like.

Figure 3:
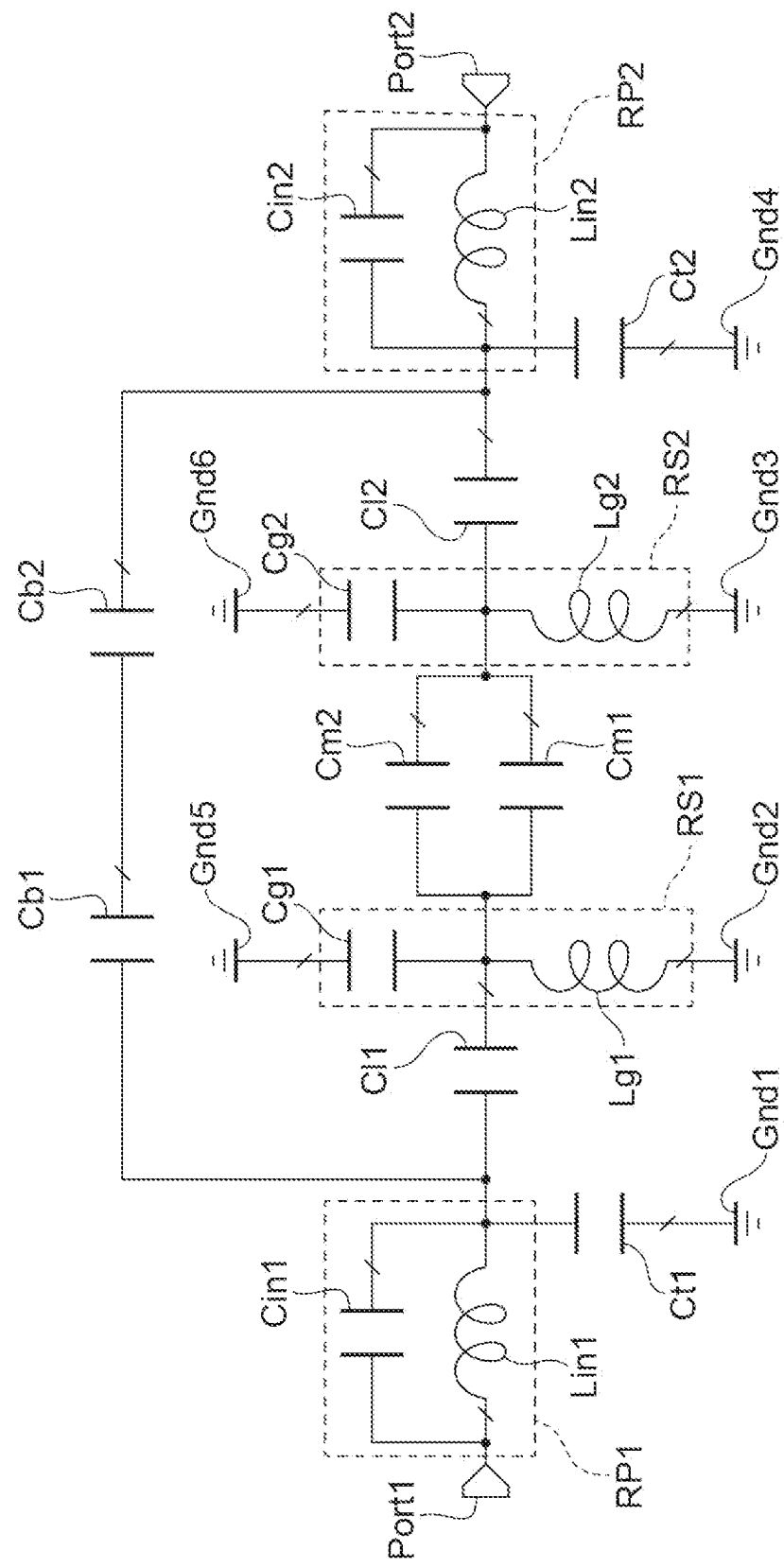
FIG. 3 is an equivalent circuit diagram of the multilayer filter.

As illustrated in FIG. 3, the multilayer filter 1 includes a first port Port1 to and from which signals are input and output, a second port Port2 to and from which signals are input and output, a first LC parallel resonance unit RP1, a second LC parallel resonance unit RP2, a first LC series resonance unit (LC circuit unit) RS1, and a second LC series resonance unit (LC circuit unit) RS2. The multilayer filter 1 includes a ground Gnd1, a ground Gnd2, a ground Gnd3, a ground Gnd4, a ground Gnd5, and a ground Gnd6. Each resonance unit can be rephrased as a resonator or a resonance circuit.

The first port Port 1 is configured by the first terminal electrode 3. The second port Port 2 is configured by the second terminal electrode 4. The ground Gnd1 is configured by the third ground electrode 7. The ground Gnd 2 is configured by the third ground electrode 7. The ground Gnd 3 is configured by the fourth ground electrode 8. The ground Gnd 4 is configured by the fourth ground electrode 8. The ground Gnd 5 is configured by the first ground electrode 5. The ground Gnd 6 is configured by the second ground electrode 6.

The first LC parallel resonance unit RP1 is configured to include a first inductor Lin1 and a first capacitor Cin1. The first inductor Lin1 and the first capacitor Cin1 are connected in parallel. One end portion of the first LC parallel resonance unit RP1 is connected to the first port Port1. The first inductor Lin1 is configured to include the second coil conductor 11, the sixth coil conductor 15, the tenth coil conductor 19, the via conductors 22c, 23c, 24c, 25c, 26c, 28c, 29c, and 30c, the via conductors 22d, 23d, 24d, 25d, 26d, 28d, 29d, and 30d, and the through-hole conductors H3 and H4. The first capacitor Cin1 is configured by the second internal electrode 31 and the fourth internal electrode 34.

The second LC parallel resonance unit RP2 is configured to include the second inductor Lin2 and the second capacitor Cin2. The second inductor Lin2 and the second capacitor Cin2 are connected in parallel. One end portion of the second LC parallel resonance unit RP2 is connected to the second port Port2. The second inductor Lin2 is configured to include the third coil conductor 12, the seventh coil conductor 16, the eleventh coil conductor 20, the via conductors 22e, 23e, 24e, 25e, 26e, 28e, 29e, 30e, and 33d, the via conductors 22f, 23f, 24f, 25f, 26f, 28f, 29f, and 30f, and the through-hole conductors H5 and H6. The second capacitor Cin2 is configured by the third internal electrode 32 and the fifth internal electrode 35.

The first LC series resonance unit RS1 is configured to include a third inductor Lg1 and a third capacitor Cg1. One end portion of the first LC series resonance unit RS1 is connected to the ground Gnd2, and the other end portion of the first LC series resonance unit RS1 is connected to the ground Gnd5. The third inductor Lg1 and the third capacitor Cg1 are connected in series.

The third inductor Lg1 is configured to include the first coil conductor 10, the fifth coil conductor 14, the ninth coil conductor 18, the via conductors 22a, 23a, 24a, 25a, 26a, 28a, 29a, 30a, 33a, 36a, 39a, and 44a, the via conductors 22b, 23b, 24b, 25b, 26b, 28b, 29b, 30b, 33b, and 36b, and the through-hole conductors H1 and H2. The third capacitor Cg1 is configured by the eleventh internal electrode 43 and the fourteenth internal electrode 47.

The second LC series resonance unit RS2 is configured to include a fourth inductor Lg2 and a fourth capacitor Cg2. One end portion of the second LC series resonance unit RS2 is connected to the ground Gnd3, and the other end portion of the second LC series resonance unit RS2 is connected to the ground Gnd6. The fourth inductor Lg2 and the fourth capacitor Cg2 are connected in series.

The fourth inductor Lg2 is configured to include the fourth coil conductor 13, the eighth coil conductor 17, the twelfth coil conductor 21, the via conductor 22g, 23g, 24g, 25g, 26g, 28g, 29g, 30g, 33e, 36d, 39f, and 44c, the via conductors 22h, 23h, 24h, 25h, 26h, 28h, 29h, 30h, 33f, and 36e, and the through-hole conductors H7 and H8. The fourth capacitor Cg2 is configured by the tenth internal electrode 42 and the thirteenth internal electrode 46.

A capacitor Ct1 is disposed between the first LC parallel resonance unit RP1 and the ground Gnd1. The capacitor Ct1 is configured by the eighth internal electrode 40 and the twelfth internal electrode 45. A capacitor Ct2 is disposed between the second LC parallel resonance unit RP2 and the ground Gnd2. The capacitor Ct2 is configured by the ninth internal electrode 41 and the twelfth internal electrode 45.

A capacitor Cl1 is disposed between the first LC parallel resonance unit RP1 and the first LC series resonance unit RS1. The capacitor Cl1 is configured by the fourth internal electrode 34 and the sixth internal electrode 37. A capacitor Cl2 is disposed between the second LC parallel resonance unit RP2 and the second LC series resonance unit RS2. The capacitor Cl2 is constituted by the fifth internal electrode 35 and the seventh internal electrode 38.

A capacitor Cm1 and a capacitor Cm2 are disposed between the first LC series resonance unit RS1 and the second LC series resonance unit RS2. The capacitor Cm1 and the capacitor Cm2 are connected in parallel. The capacitor Cm1 is configured by the sixth internal electrode 37 and the tenth internal electrode 42. The capacitor Cm2 is configured by the seventh internal electrode 38 and the eleventh internal electrode 43.

A capacitor Cb1 and a capacitor Cb2 are disposed between the first LC parallel resonance unit RP1 and the second LC parallel resonance unit RP2. The capacitor Cb1 and the capacitor Cb2 are connected in series. The capacitor Cb1 is configured by the first internal electrode 27 and the fourth internal electrode 34. The capacitor Cb2 is configured by the first internal electrode 27 and the fifth internal electrode 35.

In the multilayer filter 1, the first LC series resonance unit RS1 and the second LC series resonance unit RS2 are provided between the first LC parallel resonance unit RP1 and the second LC parallel resonance unit RP2 in a signal path between the first port Port1 and the second port Port2. In the multilayer filter 1, the first inductor Lin1 of the first LC parallel resonance unit RP1 and the second inductor Lin2 of the second LC parallel resonance unit RP2 are magnetically coupled to each other. In the multilayer filter 1, the third inductor Lg1 of the first LC series resonance unit RS1 and the fourth inductor Lg2 of the second LC series resonance unit RS2 are magnetically coupled to each other. In the multilayer filter 1, the magnetic coupling between the first inductor Lin1 of the first LC parallel resonance unit RP1 and the second inductor Lin2 of the second LC parallel resonance unit RP2 is greater than the magnetic coupling between the third inductor Lg1 of the first LC series resonance unit RS1 and the fourth inductor Lg2 of the second LC series resonance unit RS2.

In the element body 2 of the multilayer filter 1, a conductor pattern constituting the third inductor Lg1 constituting the first LC series resonance unit RS1 and a conductor pattern constituting the fourth inductor Lg2 constituting the second LC series resonance unit RS2 are not disposed between a conductor pattern constituting the first inductor Lin1 of the first LC parallel resonance unit RP1 and a conductor pattern constituting the second inductor Lin2 of the second LC parallel resonance unit RP2.

Figure 4:
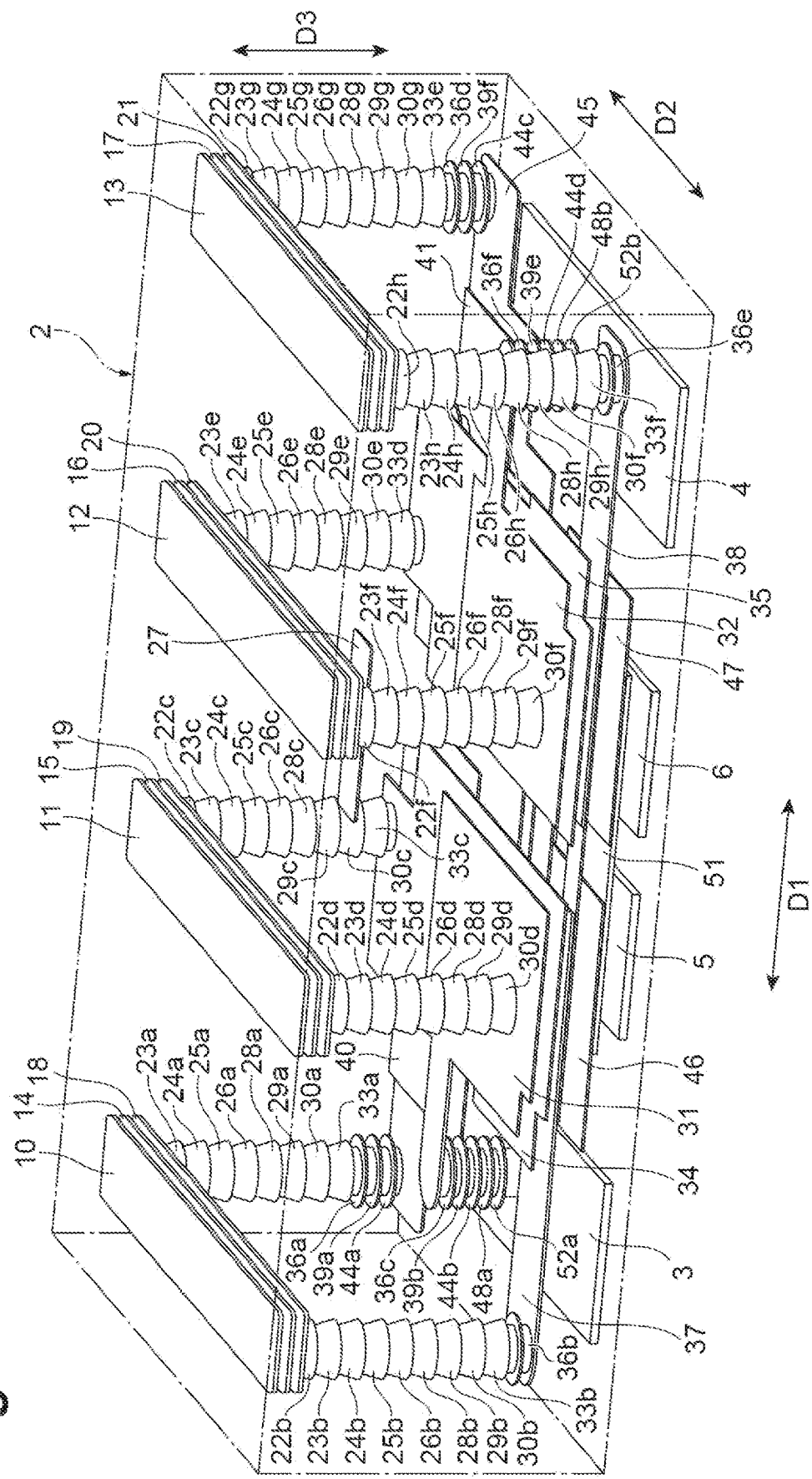
FIG. 4 is a view illustrating an internal configuration of the multilayer filter.

Specifically, as illustrated in FIG. 4, the first coil conductor 10, the fifth coil conductor 14, the ninth coil conductor 18, the via conductors 22a, 23a, 24a, 25a, 26a, 28a, 29a, 30a, 33a, 36a, 39a, and 44a, the via conductors 22b, 23b, 24b, 25b, 26b, 28b, 29b, 30b, 33b, and 36b, and the through-hole conductors H1 and H2 constituting the third inductor Lg1 of the first LC series resonance unit RS1 and the fourth coil conductor 13, the eighth coil conductor 17, the twelfth coil conductor 21, the via conductor 22g, 23g, 24g, 25g, 26g, 28g, 29g, 30g, 33e, 36d, 39f, and 44c, the via conductors 22h, 23h, 24h, 25h, 26h, 28h, 29h, 30h, 33f, and 36e, and the through-hole conductors H7 and H8 constituting the fourth inductor Lg2 of the second LC series resonance unit RS2 are not disposed between the second coil conductor 11, the sixth coil conductor 15, the tenth coil conductor 19, the via conductors 22c, 23c, 24c, 25c, 26c, 28c, 29c, and 30c, the via conductors 22d, 23d, 24d, 25d, 26d, 28d, 29d, and 30d, and the through-hole conductors H3 and H4 constituting the first inductor Lin1 of the first LC parallel resonance unit RP1 and the third coil conductor 12, the seventh coil conductor 16, the eleventh coil conductor 20, the via conductors 22e, 23e, 24e, 25e, 26e, 28e, 29e, 30e, and 33d, the via conductors 22f, 23f, 24f, 25f, 26f, 28f, 29f, and 30f, and the through-hole conductors H5 and H6 constituting the second inductor Lin2 of the second LC parallel resonance unit RP2.

In the multilayer filter 1 of the element body 2, the first LC series resonance unit RS1 and the second LC series resonance unit RS2 are disposed at positions sandwiching the first LC parallel resonance unit RP1 and the second LC parallel resonance unit RP2 therebetween and disposed to be spaced apart on outer sides of the first LC parallel resonance unit RP1 and the second LC parallel resonance unit RP2. As a result, in the element body 2 of the multilayer filter 1, a distance of the element body 2 in the first direction D1 between the conductor pattern constituting the first inductor Lin1 of the first LC parallel resonance unit RP1 and the conductor pattern constituting the second inductor Lin2 of the second LC parallel resonance unit RP2 is smaller than a distance between the conductor pattern constituting the third inductor Lg1 of the first LC series resonance unit RS1 and the conductor pattern constituting the fourth inductor Lg2 of the second LC series resonance unit RS2. That is, in the element body 2 of the multilayer filter 1, the conductor pattern constituting the third inductor Lg1 of the first LC series resonance unit RS1 and the conductor pattern constituting the fourth inductor Lg2 of the second LC series resonance unit RS2 are disposed to be more spaced apart from each other than a spacing between the conductor pattern constituting the first inductor Lin1 of the first LC parallel resonance unit RP1 and the conductor pattern constituting the second inductor Lin2 of the second LC parallel resonance unit RP2 in the first direction D1 of the element body 2.

As described above, in the element body 2 of the multilayer filter 1 according to the present embodiment, the conductor patterns constituting the inductors constituting the first LC series resonance unit RS1 and the second LC series resonance unit RS2 are not disposed between the conductor pattern constituting the first inductor Lin1 of the first LC parallel resonance unit RP1 and the conductor pattern constituting the second inductor Lin2 of the second LC parallel resonance unit RP2. As described above, in the multilayer filter 1, since the inductors of the first LC series resonance unit RS1 and the second LC series resonance unit RS2 are not disposed between the first LC parallel resonance unit RP1 and the second LC parallel resonance unit RP2, a physical distance between the first LC parallel resonance unit RP1 and the second LC parallel resonance unit RP2 can be reduced. Thereby, in the multilayer filter 1, the magnetic coupling between the first inductor Lin1 and the second inductor Lin2 can be increased. Therefore, in the multilayer filter 1, a distance between an attenuation peak (attenuation pole) of the first LC parallel resonance unit RP1 and an attenuation peak of the second LC parallel resonance unit RP2 can be increased. Therefore, attenuation can be made to be steep in the multilayer filter 1. As a result, an attenuation characteristic can be improved in the multilayer filter 1.

In FIG. 5, an attenuation characteristic of a conventional multilayer filter is illustrated by a broken line, and an attenuation characteristic of the multilayer filter 1 according to the present embodiment is illustrated by a solid line. In FIG. 5, the horizontal axis represents a frequency [GHz] and the vertical axis represents an absolute value [dB]. In an element body of the conventional multilayer filter, conductor patterns constituting a first LC series resonance unit and a second LC series resonance unit are disposed between a conductor pattern constituting a first inductor of a first LC parallel resonance unit and a conductor pattern constituting a second inductor of a second LC parallel resonance unit. In FIG. 5, an attenuation peak Fr1 of the first LC parallel resonance unit RP1 and an attenuation peak Fr2 of the second LC parallel resonance unit RP2 of the multilayer filter 1 are each surrounded by a broken line. Similarly, an attenuation peak Fr11 of the first LC parallel resonance unit and an attenuation peak Fr22 of the second LC parallel resonance unit of the conventional multilayer filter are each surrounded by a broken line.

As illustrated in FIG. 5, in the multilayer filter 1, since the magnetic coupling between the first LC parallel resonance unit RP1 and the second LC parallel resonance unit RP2 can be made to be large, the attenuation peak Fr1 of the first LC parallel resonance unit RP1 can be shifted to a low frequency side, and the attenuation peak Fr2 of the second LC parallel resonance unit RP2 can be shifted to a high frequency side. Thereby, a distance between the attenuation peak Fr1 of the first LC parallel resonance unit RP1 and the attenuation peak Fr2 of the second LC parallel resonance unit RP2 can be further increased in a frequency band on the high frequency side in the multilayer filter 1 compared to that between the attenuation peak Fr11 and the attenuation peak Fr22 of the conventional multilayer filter. Thereby, the attenuation can be made to be steep in the frequency band on the high frequency side in the multilayer filter 1. Therefore, the attenuation characteristic can be improved in the multilayer filter.

The multilayer filter 1 according to the present embodiment includes the first LC series resonant unit RS1 configured by the third inductor Lg1 and the third capacitor Cg1 connected in series and the second LC series resonance unit RS2 configured by the fourth inductor Lg2 and the fourth capacitor Cg2 connected in series. In the element body 2, the first LC series resonance unit RS1 and the second LC series resonance unit RS2 are disposed at positions sandwiching the first LC parallel resonance unit RP1 and the second LC parallel resonance unit RP2 therebetween and are disposed to be spaced apart on outer sides of the first LC parallel resonance unit RP1 and the second LC parallel resonance unit RP2. In this configuration, the magnetic coupling between the third inductor Lg1 of the first LC series resonance unit RS1 and the fourth inductor Lg2 of the second LC series resonance unit RS2 is made to be small compared to the magnetic coupling between the first inductor Lin1 of the first LC parallel resonance unit RP1 and the second inductor Lin2 of the second LC parallel resonance unit RP2. Thereby, a filter having a deep attenuation in a narrow band of frequencies can be realized in the multilayer filter 1. Therefore, the attenuation characteristic can be improved in the multilayer filter 1.

While an embodiment of the present invention has been described above, the present invention is not necessarily limited to the above-described embodiment, and various modifications can be made within a range not departing from the gist of the invention.

In the above-described embodiment, a configuration in which the LC circuit unit includes the first LC series resonance unit RS1 and the second LC series resonance unit RS2 has been described as an example. However, the LC circuit unit may be a balanced low-pass filter or the like.

In the above-described embodiment, a configuration in which the multilayer filter 1 is a bandpass filter configured to include the first LC parallel resonance unit RP1, the second LC parallel resonance unit RP2, the first LC series resonance unit RS1, and the second LC series resonance unit RS2 has been described as an example. However, the multilayer filter may be a multiplexer including the bandpass filter. In this configuration, the multilayer filter further includes a terminal electrode.

In the above-described embodiment, a configuration including the first LC series resonance unit RS1 and the second LC series resonance unit RS2 has been described as an example. However, the configuration may further include an additional LC series resonance unit.

In the above-described embodiment, a configuration in which the first inductor Lin1 is configured by the second coil conductor 11, the sixth coil conductor 15, the tenth coil conductor 19, the via conductors 22c, 23c, 24c, 25c, 26c, 28c, 29c, and 30c, and the via conductors 22d, 23d, 24d, 25d, 26d, 28d, 29d, and 30d has been described as an example. However, the first inductor Lin1 may be configured by the second coil conductor 11, the sixth coil conductor 15, and the tenth coil conductor 19. That is, the first inductor Lin1 may be configured by only the conductor patterns. The same applies to the second inductor Lin2, the third inductor Lg1, and the fourth inductor Lg2.

In the above-described embodiment, a configuration in which the first terminal electrode 3, the second terminal electrode 4, the first ground electrode 5, the second ground electrode 6, the third ground electrode 7, and the fourth ground electrode 8 are disposed on the second main surface 2b of the element body 2 has been described as an example. However, the disposition of the electrodes is not limited thereto.

What is claimed is:
1. A multilayer filter comprising:
   an element body formed by laminating a plurality of insulator layers; and
   a first terminal and a second terminal disposed on an outer surface of the element body, wherein
   the inside of the element body is configured by:
      a first LC parallel resonance unit configured by a first inductor and a first capacitor connected in parallel;
      a second LC parallel resonance unit configured by a second inductor and a second capacitor connected in parallel; and
      two LC circuit units each configured to include an inductor and a capacitor,
   the two LC circuit units are connected between the first LC parallel resonance unit and the second LC parallel resonance unit in a path between the first terminal and the second terminal, none of a conductor pattern constituting the inductor of a first LC circuit of the two LC circuit units and a conductor pattern constituting the inductor of a second LC circuit of the two LC circuit units is disposed between a conductor pattern constituting the first inductor of the first LC parallel resonance unit and a conductor pattern constituting the second inductor of the second LC parallel resonance unit in the element body, a distance between the first inductor and the second inductor in the element body is shorter than a distance between the conductor pattern constituting the inductor of the first LC circuit and the conductor pattern constituting the inductor of the second LC circuit, and the first inductor of the first LC parallel resonance unit and the second inductor of the second LC parallel resonance unit are magnetically coupled.

2. The multilayer filter according to claim 1, wherein
the first LC circuit unit is a first LC series resonance unit configured by a third inductor and a third capacitor connected in series, the second LC circuit unit is a second LC series resonance unit configured by a fourth inductor and a fourth capacitor connected in series, and the first LC series resonance unit and the second LC series resonance unit are disposed at positions sandwiching the first LC parallel resonance unit and the second LC parallel resonance unit therebetween and disposed to be spaced apart on outer sides of the first LC parallel resonance unit and the second LC parallel resonance unit.

3. The multilayer filter according to claim 2, wherein the first inductor, the second inductor, the third inductor, and the fourth inductor are each configured by a conductor pattern and a through-hole conductor.

4. The multilayer filter according to claim 1, which is a multiplexer including a bandpass filter configured to have the first LC parallel resonance unit, the second LC parallel resonance unit, and the two LC circuit units.

\* \* \* \* \*